United States Patent [19]

Dunn et al.

[11] Patent Number: 4,896,811
[45] Date of Patent: Jan. 30, 1990

[54] MACHINE FOR BONDING LEADS TO NON-COPLANAR SUBSTRATES

[75] Inventors: Gerald R. Dunn, Carlsbad; Dean R. Haagenson, Vista, both of Calif.; Michael J. Pirozzoli, Pine Springs, Minn.

[73] Assignee: Unisys Corporation, Blue Bell, Pa.

[21] Appl. No.: 353,377

[22] Filed: May 16, 1989

[51] Int. Cl.⁴ .......................................... H01L 21/603
[52] U.S. Cl. ....................................... 228/5.5; 228/6.2
[58] Field of Search ............... 228/106, 5.5, 6.2, 180.2

[56] References Cited

U.S. PATENT DOCUMENTS

| | | | |
|---|---|---|---|
| 3,475,814 | 11/1969 | Santangini | 228/180.2 X |
| 3,574,923 | 4/1971 | Cushman | 228/180.2 |
| 3,957,185 | 5/1976 | Kauffman et al. | 228/106 |
| 4,573,627 | 3/1986 | Miller et al. | 228/180.2 X |

*Primary Examiner*—Kenneth J. Ramsey
*Attorney, Agent, or Firm*—Charles J. Fassbender; Robert S. Bramson

[57] ABSTRACT

A machine for bonding leads from a chip to a substrate having top and bottom surfaces that are non-coplanar is comprised of a carrier for the substrate which includes a frame having a set of stops that terminate in a single plane and which are arranged in a pattern with a central opening. Also included in the carrier is a forcing mechanism which pushes on the bottom surface of the substrate such that the top surface of the substrate is pinned directly against all of the stops simultaneously and a portion of that top surface is exposed through the opening. This causes the exposed portion of the substrate's top surface to be aligned with the plane of the stops regardless of the degree of non-coplanarity that exists between the substrate's top and bottom surfaces. Further included in the machine are bonding blades which lie parallel to the single plane of the stops, and they move perpendicular to that plane through the opening to bond leads to the exposed top surface portion of the substrate as it is pinned to the stops.

11 Claims, 3 Drawing Sheets

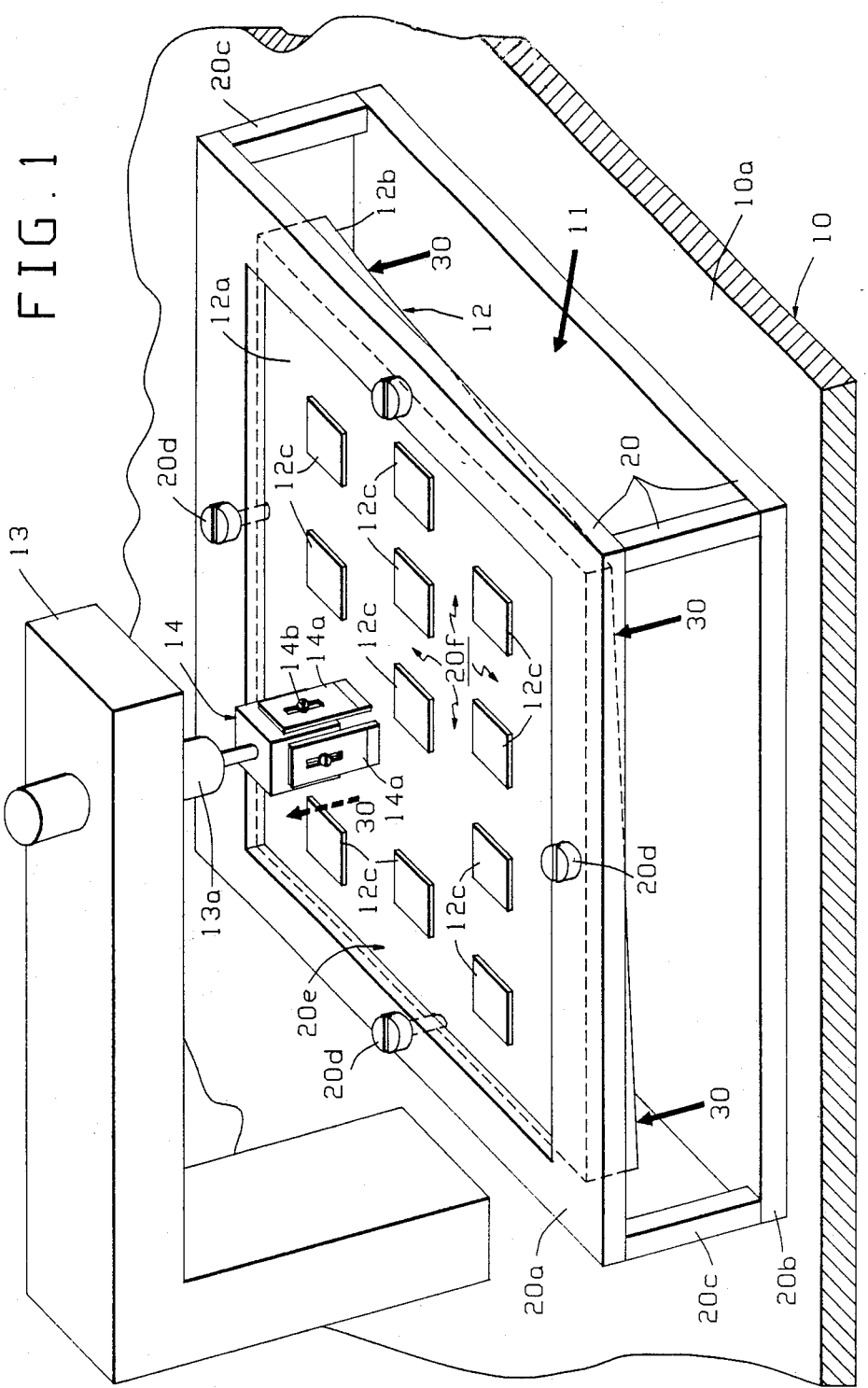

MACHINE FOR BONDING LEADS TO NON-COPLANAR SUBSTRATES

BACKGROUND OF THE INVENTION

This invention relates to bonding machines which bond input/output leads from integrated circuit chips to conductors on the top surface of a substrate; and more particularly, it relates to those bonding machines which compensate during the bonding operation for misalignments that are caused by differences in planarity between the substrates' top and bottom surfaces.

Integrated circuits are made on thin, flat silicon chips which range from about 1/8 inch to 1/2 inch on a side. Several of these chips are commonly attached by an epoxy to the top surface of a substrate on which electrical interconnections for the chips are patterned, and leads are bonded between bonding pads on the conductors and bonding pads on the chips. Some machines bond these leads as discrete wires one at a time, while other machines bond all of the leads from one hip simultaneously.

With the latter type bonding machine, the leads for each chip are preformed and held at a certain pitch by an insulator film such as a polyimide. These lead assemblies are commonly referred to as tape automated bonding assemblies or TAB assemblies. To attach the leads of a TAB assembly to the chip and the substrate, the bonding machine includes blades which are heated by an electric current and which squeezes the leads against the chip and the substrate at a certain pressure.

If, however, the pressure that is exerted on the leads by the bonding machine blades is too large, the leads will be squeezed towards each other and thereby cause a short circuit. Conversely, if the pressure that is exerted by the blades is too small, the resulting bond will be too weak which will result in an open circuit. Thus, it is very important to have the pressure that is exerted by the bonding blades be precisely controlled and distributed across the leads uniformly.

But such uniformity in the bonding pressure has been particularly difficult to achieve in the prior art. This is because the substrates on which the chips lie often have non-coplanar top and bottom surfaces; and in the prior art bonding machines, the substrates rested on their bottom surface while the bonding blade squeezed the leads against the chip and the substrate top surface. Consequently, the bonding blades and the substrate's top surface were at angles that varied from substrate to substrate depending upon the degree of non-coplanarity between the substrate's top and bottom surfaces.

In an effort to solve this problem, one type of prior art bonding machine by MCC of Austin, Texas, has its bonding blades mounted on a gimbal. In operation, the blades are moved towards the substrate's top surface until a portion of the blades makes initial contact with a portion of the leads on the top surface. Thereafter, further movement of the blades toward the substrate causes the blades to tilt on the gimbal until the plane of the blades coincides with the plane of the substrate's top surface.

A drawback, however, with such a gimbal-mounted bonding machine is that pressure must be applied to just a portion of the leads in order to make the plane of the blades and the plane of the substrate's top surface coincide. Consequently, it is inherent to the bonder's operation that pressure is not uniformly distributed across the leads at all times; and so with finely pitched leads, short circuits can result.

Another drawback with the gimbal-mounted bonder is that as the blades pivot on the gimbal in order to align themselves with the substrate's top surface, the pivotal motion moves the blades both perpendicular and parallel to the leads. And, due to the parallel component of this motion, the blades misalign themselves with respect to the bonding pads. Such misalignment can degrade the mechanical strength of a bond and thereby cause long-term reliability problems and open circuits.

Accordingly, a primary object of the invention is to provide an improved bonding machine in which all of the above prior art problems are eliminated.

BRIEF SUMMARY OF THE INVENTION

In accordance with the invention, a machine for bonding leads from a chip to a substrate having top and bottom surfaces that are non-coplanar is comprised of a carrier for the substrate which includes a frame having a set of stops that terminate in a single plane and which are arranged in a pattern with a central opening. This carrier further includes a forcing mechanism which pushes on the bottom surface of the substrate such that the top surface of the substrate is pinned directly against all of the stops simultaneously and a portion of that top surface is exposed through the opening. As a result, the exposed portion of the substrate's top surface is aligned with the plane of the stops regardless of the degree of non-coplanarity that exists between the substrate's top and bottom surfaces. Further included in the machine are bonding blades which lie parallel to the single plane of the stops, and they move perpendicular to that plane through the opening to bond leads to the exposed top surface portion of the substrate as it is pinned to the stops.

BRIEF DESCRIPTION OF THE DRAWINGS

Various features and advantages of the invention are described herein and in conjunction with accompanying drawings wherein:

FIG. 1 is a pictorial view of one preferred embodiment of the invention;

Figure 3:
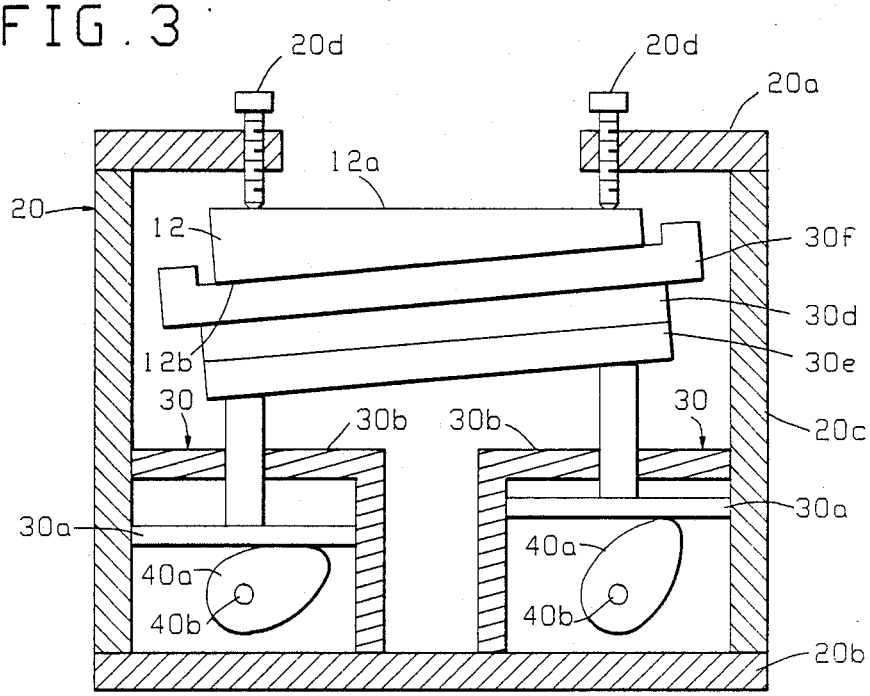
Figure 4:
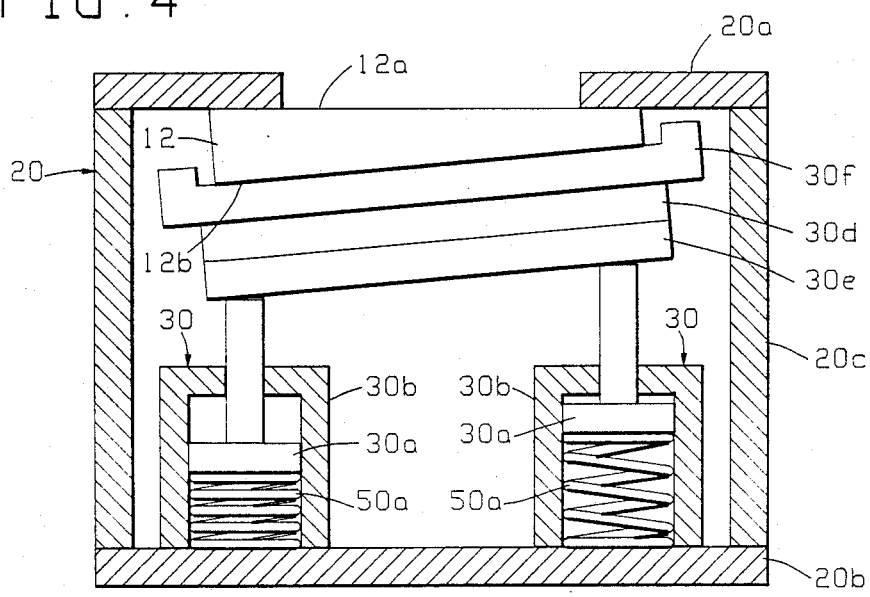

FIG's 2A and 2B illustrate the structural and operational details of one preferred forcing mechanism that is included within the FIG. 1 machine;

FIG. 3 shows an alternative embodiment of a forcing mechanism for the FIG. 1 machine; and FIG. 4 shows another alternative embodiment of a forcing mechanism for the FIG. 1 machine.

DETAILED DESCRIPTION OF THE INVENTION

Referring now to FIG. 1, a preferred embodiment of a bonding machine which is constructed in accordance with the invention, will be described in detail. This bonding machine includes a base 10 having a smooth, flat surface 10a, a carrier 11 which slides on the surface 10a and which carries a substrate 12, and an arm 13 which is fastened to the base and which contains a piston 13a that positions a thermoelectric device 14 over the substrate 12. Carrier 11 consists of a frame 20 and a forcing mechanism 30, the latter of which is only shown schematically in FIG. 1 as four arrows. All the structural details of the forcing mechanism 30 are shown in the FIG's 2A, 2B, 3, and 4.

Frame 20 includes a top member 20A, a bottom member 20B, four side supports 20C, and four stops 20D. All of those components are interconnected to each other as illustrated. Suitably, the components 20A-20D are made of a metal such as aluminum, or alternatively they are made of plastic. Member 20A has a central opening 20E around which the stops 20D are located. Those stops 20D screw through the member 20A, and that enables their ends to be adjusted to all lie in a single plane 20F.

Lying in that same plane 20F is the top surface 12A of substrate 12. That occurs because the forcing mechanism 30 pushes against the bottom surface 12B of substrate 12 which in turn pins the top surface 12A against the ends of the stops 20D. Due to that pinning action, surface 12A is aligned with plane 20F even when the substrate surfaces 12A and 12B are non-coplanar. Consequently, the substrate 12 will be properly aligned when it has a non-uniform thickness, such as that which is shown in FIG. 1.

Also aligned to the plane 20F is a set of blades 14A on the thermoelectric device 14. That alignment is made by means four screws 14B, each of which holds one blade in place. Such alignment of the blades 14A and top surface 12A to the same plane 20F is critical because it enables the blades 14A to compress and bond respective rows of leads to bonding pads on the surface 12A with a pressure that is uniformly distributed across the leads.

In FIG. 1, each of the squares 12c represents an integrated circuit chip from which the leads that are to be bonded extend in a cantilevered fashion over the bonding pads. One such chip with its leads is shown in greater detail in FIG'S 2A and 2B. If the blades 14A and the pads on surface 12A were in different planes, then the pressure exerted by the blades 14A would be too large for one portion of the leads and too small for another portion of the leads. And, as was pointed out in the background, leads which are bonded with too large of a pressure will short together whereas leads which are bonded with too small of a pressure will result in open circuits.

Figure 2A:
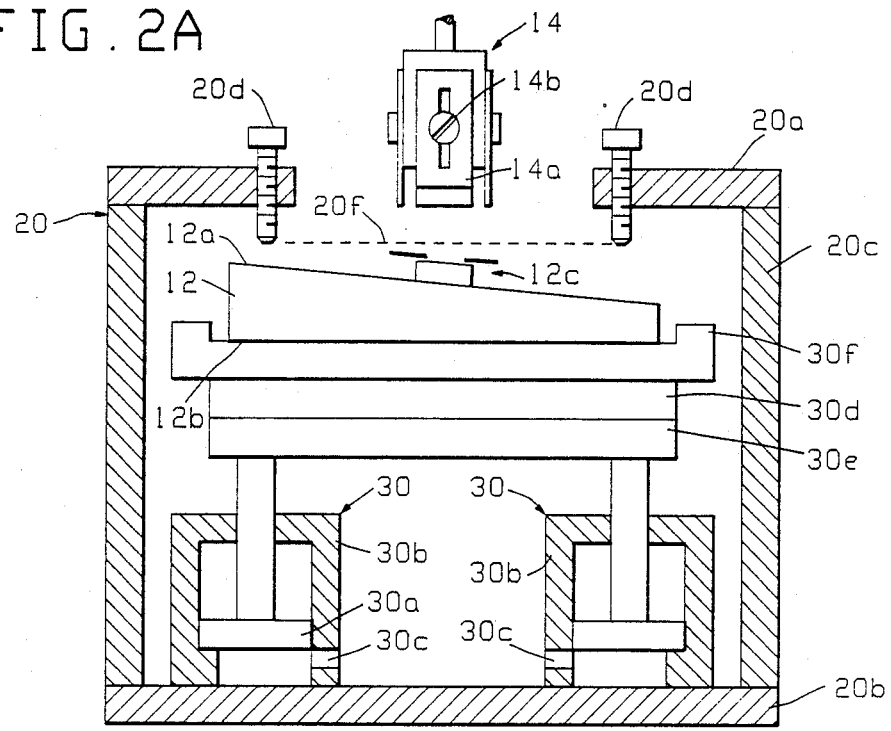

Turning next to FIG'S 2A and 2B, the structural details and operation of a preferred embodiment for the forcing mechanism 30 will be described. In this embodiment, the forcing mechanism 30 includes a set of pistons 30A which move up and down in respective cylinders 30B. One such piston and its corresponding cylinder is located near each of the corners of opening 20E. Each of the cylinders 30B has an orifice 30C through which compressed air is forced to move the pistons. FIG. 2A shows the position of the pistons 30A when no air pressure is applied, whereas FIG. 2B shows the position of the pistons 30A when the air pressure is applied.

The total force which the pistons 30A exert must be large enough to keep the substrate surface 12A pinned against the stops 20D while the blades 14A squeeze and bond the leads from the chips 12C to bonding pads on the substrate. At the same time, the total force which the pistons 30A exert must not be so large as to cause the substrate surface 12A to deflect and bow. To meet these constraints, the force which the pistons exert should vary depending on the substrate material and its dimensions, as well as the bonding force per lead and the number of leads. For example, for a ceramic substrate that is 50 mils thick $\pm 2$ mils and 5 inches across to which 355 leads are to be bonded simultaneously at 20 grams per lead, a suitable total force for the pistons 30A to exert is 32 pounds.

Figure 2B:
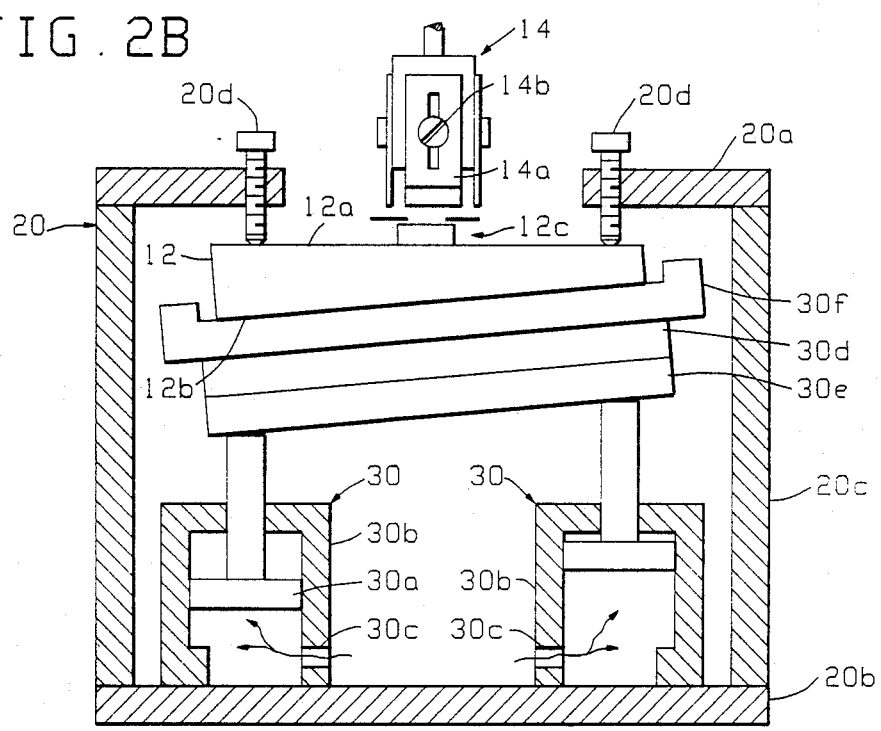

Also in the FIG. 2A-2B embodiment, the pistons 30A do not push directly against the bottom surface 12B of the substrate. Instead, the forcing mechanism 30 includes additional members which are disposed between the pistons 30A and the substrate bottom surface 12B. Those members consist of an electric heating plate 40A, an insulator plate 40B, and a holder 40C for the substrate; and they operate to preheat the substrate to a certain temperature which is slightly below the actual bonding temperature of the blades 14A.

A primary feature of the above described bonding machine is that the blades 14A need to be aligned with the plane 20F only one time. After that initial alignment, the blades 14A will be aligned with the planar top surface 12A of any substrate, regardless of how non-coplanar the substrate's top and bottom surfaces are. This feature makes the machine practical for use in a mass-production environment in which hundreds or thousands of substrates, each of which have different degrees of non-coplanarity, need to be processed. If the blades 14A had to be separately adjusted for each substrate, the labor cost per substrate would substantially increase and the degree of bonding uniformity from one substrate to another would decrease.

Another feature of the above-described bonding machine is that the bonding blades 14A apply equal pressure to the leads on the chips 12C at all times during the bonding operation. This compares favorably with the gimbal-mounted bonder that was referred to in the BACKGROUND which applies unequal pressure to the leads as the bonding blades make their initial contact with the leads. Consequently, with the above-described bonding machine, short circuits and open circuits on even very closely spaced leads, e.g., 2 mils apart, are avoided.

Still another feature of the above-described bonding machine is that the piston 13A moves the blades 14A only perpendicular to the plane 20F. Thus, once the carrier 11 is positioned on the base surface 10A such that the leads of a chip 12C are aligned with the blades 14B, that alignment remains throughout the bonding operation. That, however, is not the case in the gimbal-mounted bonder in which the bonding blades are required to move parallel to the substrates top surface 12A in order to lie in the same plane as that surface.

A preferred embodiment of the invention has now been described in detail. In addition, however, many changes and modifications can be made to those details without departing from the nature and spirit of the invention. For example, two such modifications are shown in FIG. 3 and 4.

In the FIG. 3 embodiment, the forcing mechanism 30 is modified such that the pistons 30B are moved by a set of cams 40A. Each cam is attached to a separate shaft 40B which enables an operator to rotate the cams by different angles until the substrate's top surface 12A is pinned against the stops 20D.

In the FIG. 4 embodiment, the pistons 30A are moved by a set of springs 50A. One such spring is inserted in each of the cylinders 30B, and they move the pistons by different distances such that the top surface of the substrate is again aligned with the plane 20F. Also in the FIG. 4 embodiment, the mechanically adjustable stops 20D are eliminated; and the portion of the top frame member 20A which borders the hole 20E serves as a stop for the substrate. Thus, the portion of the top frame member 20A which stops the substrate 12 needs to be precisely machined such that it lies in a single plane.

In view of the above variations and modifications that can be made, it is to be understood that the invention is not limited to the specific embodiments that have been described, but is defined by the appended claims.

What is claimed is:

1. A machine for bonding leads to a substrate having top and bottom surfaces that are non-coplanar; wherein said machine is comprised of:
   a carrier for said substrate which includes a frame having a set of stops that terminate in a single plane and which are arranged in a pattern with a central opening;
   a forcing means, in said carrier, for pinning said top surface of said substrate directly against all of said stops simultaneously, such that a portion of said top surface is exposed through said opening and is aligned with said single plane, by pushing on said bottom surface; and,
   a bonding module having blades which lie parallel to said single plane and which move through said opening and bond leads to the exposed portion of said top surface.

2. A machine according to claim 1 wherein said forcing means includes several pistons which are spaced apart from each other and which move by different distances to compensate for said non-coplanar surfaces and push against said bottom surface with equal force.

3. A machine according to claim 2 wherein said carrier further includes an insulating member mounted on said pistons, a heating member on said insulating member, and a holder for said substrate on said heating member.

4. A machine according to claim 3 and further including a base member having a smooth flat surface on which said carrier slides such that said stops remain in said plane.

5. A machine according to claim 4 wherein said stops are attached to said frame such that said plane in which said stops terminate is mechanically selectable.

6. A machine according to claim 5 wherein said opening is at least three inches across in one direction.

7. A machine for bonding leads to a planar surface of a substrate having non-uniform thickness; wherein said machine is comprised of:
   a carrier for said substrate which includes an aligning member that terminates in a single plane and which has a central opening;
   a forcing means, on said carrier, for forcing said planar surface of said substrate directly against said aligning member such that a portion of said planar surface is exposed through said opening and is oriented parallel to said single plane; and,
   a bonding means having blades which lie parallel to said single plane and which move through said opening and bond leads to the exposed portion of said substrate wherein,
   said blades of said bonding means tend to push said planar surface out of said single plane, but said forcing means keeps said planar surface against said aligning member and in said single plane.

8. A machine according to claim 7 wherein said forcing means includes at least one spring for forcing said planar surface of said substrate against said frame member.

9. A machine according to claim 7 wherein said forcing means includes at least one spring for forcing said planar surface of said substrate against said frame member.

10. A machine according to claim 7 wherein said forcing means includes at least one cam for forcing said planar surfaces of said substrate against frame member.

11. A bonding machine which is comprised of:
    a frame having a plurality of contact points that define a single plane;
    a forcing means, for orienting a workpiece parallel to said single plane by pinning said workpiece against said contact points;
    said frame having an opening which exposes a portion of said workpiece as it is pinned against said contact points; and,
    a bonding means having a blade which is parallel to said plane and which contacts said exposed workpiece portion through said opening.

* * * * *